(12) United States Patent
Holzrichter

(10) Patent No.: US 7,120,184 B2
(45) Date of Patent: Oct. 10, 2006

(54) PHASING SURFACE EMITTING DIODE LASER OUTPUTS INTO A COHERENT LASER BEAM

(75) Inventor: John F. Holzrichter, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 271 days.

(21) Appl. No.: 10/804,282

(22) Filed: Mar. 18, 2004

(65) Prior Publication Data
US 2005/0207465 A1 Sep. 22, 2005

(51) Int. Cl.
H01S 3/082 (2006.01)
H01S 3/06 (2006.01)
H01S 3/14 (2006.01)
H01S 3/091 (2006.01)

(52) U.S. Cl. ............... 372/97; 372/66; 372/68; 372/71; 372/75

(58) Field of Classification Search ............... 372/66, 372/68, 71, 75, 97
See application file for complete search history.

(56) References Cited

U.S. PATENT DOCUMENTS

| | | | |
|---|---|---|---|
| 4,757,268 A | 7/1988 | Abrams et al. | |
| 5,033,054 A | 7/1991 | Scifres et al. | |
| 5,088,105 A | 2/1992 | Scifres et al. | |
| 5,319,659 A | 6/1994 | Hohimer | |
| 5,920,588 A | 7/1999 | Watanabe | |
| 6,020,990 A | 2/2000 | Brock | |
| 6,052,218 A | 4/2000 | Chandra et al. | |
| 6,385,228 B1 | 5/2002 | Dane et al. | |
| 6,625,195 B1 | 9/2003 | Henrichs | |
| 2001/0035995 A1 | 11/2001 | Ruggiero | |

FOREIGN PATENT DOCUMENTS

| | | |
|---|---|---|
| EP | 0 571 126 A2 | 11/1993 |
| EP | 0 774 810 A2 | 5/1997 |
| EP | 1 225 669 A1 | 7/2002 |
| EP | 1 333 550 A2 | 8/2003 |
| GB | 2 370 688 A | 7/2002 |

*Primary Examiner*—Minsun Oh Harvey
*Assistant Examiner*—Marcia A. Golub
(74) *Attorney, Agent, or Firm*—Eddie E. Scott; Alan H. Thompson

(57) ABSTRACT

A system for generating a powerful laser beam includes a first laser element and at least one additional laser element having a rear laser mirror, an output mirror that is 100% reflective at normal incidence and <5% reflective at an input beam angle, and laser material between the rear laser mirror and the output mirror. The system includes an injector, a reference laser beam source, an amplifier and phase conjugater, and a combiner.

8 Claims, 3 Drawing Sheets

PHASING SURFACE EMITTING DIODE LASER OUTPUTS INTO A COHERENT LASER BEAM

The United States Government has rights in this invention pursuant to Contract No. W-7405-ENG-48 between the United States Department of Energy and the University of California for the operation of Lawrence Livermore National Laboratory.

CROSS-REFERENCE TO RELATED APPLICATIONS

This application is an improvement of the invention(s) disclosed and claimed in U.S. patent application Ser. No. 10/265,461 filed Oct. 4, 2002 by the Applicant in this patent application, John F. Holzrichter, and Anthony J. Ruggiero, for a phased laser array for generating a powerful laser beam. U.S. patent application Ser. No. 10/265,461 filed Oct. 4, 2002 and issued as U.S. Pat. No. 6,693,943 on Feb. 17, 2004.

BACKGROUND

1. Field of Endeavor

The present invention relates to lasers and more particularly to a phased laser array for generating a powerful laser beam.

2. State of Technology

European Patent No. 0571126 published Nov. 24, 1993 for an apparatus and method for optical energy amplification using two-beam coupling provides the following state of technology information: "a diffraction limited working beam at a given frequency is amplified without degrading its diffraction limited quality by diverting a minor portion of the beam as a probe beam, and amplifying the remaining portion of the working beam with a high power pump beam at a different wavelength."

U.S. Pat. No. 6,385,228 for a coherent beam combiner for a high power laser to C. Brent Dane and Lloyd A. Hackel issued May 7, 2002 provides the following state of technology information: "A phase conjugate laser mirror employing Brillouin-enhanced four wave mixing allows multiple independent laser apertures to be phase locked producing an array of diffraction-limited beams with no piston phase errors. The beam combiner has application in laser and optical systems requiring high average power, high pulse energy, and low beam divergence."

SUMMARY

The present invention is an improvement of the invention(s) disclosed and claimed in U.S. patent application Ser. No. 10/265,461 filed Oct. 4, 2002 by the Applicant in this patent application, John F. Holzrichter, and Anthony J. Ruggiero, for a phased laser array for generating a powerful laser beam. U.S. patent application Ser. No. 10/265,461 filed Oct. 4, 2002 and issued as U.S. Pat. No. 6,693,943 on Feb. 17, 2004. Features and advantages of the present invention will become apparent from the following description. Applicants are providing this description, which includes drawings and examples of specific embodiments, to give a broad representation of the invention. Various changes and modifications within the spirit and scope of the invention will become apparent to those skilled in the art from this description and by practice of the invention. The scope of the invention is not intended to be limited to the particular forms disclosed and the invention covers all modifications, equivalents, and alternatives falling within the spirit and scope of the invention as defined by the claims.

The present invention provides a system for generating a powerful laser beam. The system comprises a laser element array that includes a first laser element and at least one additional laser element. The first laser element and the at least one additional laser element have a rear laser mirror, an output mirror, and semiconductor laser material between the rear laser mirror and the output mirror. An injector directs a part of a first injection laser signal into the first laser element and directs an additional part of the first injection laser signal into the at least one additional laser element. The laser element array transforms the first part of an injection laser signal and the at least one additional part of the injection laser signal into a first circulating laser beam in the first laser element and an additional circulating laser beam in the at least one additional laser element. A reference laser beam source directs a first part of a reference laser beam into the first laser element to mix with the first circulating laser beam and directs an additional part of the reference laser beam into the at least one additional laser element to mix with the at least one additional circulating laser beam. An amplifier and phase conjugater amplifies and phase conjugates the first part of the reference laser beam and the additional part of the reference laser beam and produces a first amplified output laser beam emanating from the first laser element and an additional amplified output laser beam emanating from the at least one additional laser element. A combiner combines the first amplified output laser beam and the at least one additional amplified output laser beam into a powerful laser beam.

The present invention provides a method of generating a powerful laser beam. A first laser element is provided having a rear laser mirror, an output mirror, and semiconductor laser material between the rear laser mirror and the output mirror. At least one additional laser element is provided having a rear laser mirror, an output mirror, and semiconductor laser material between the rear laser mirror and the output mirror. A part of a first injection laser signal is injected into the first laser element. At least one additional part of the first injection laser signal is injected into the at least one additional laser element. A first part of a reference laser beam is injected into the first laser element At least one additional part of the reference laser beam is injected into the at least one additional laser element. The first part of a reference laser beam and the at least one additional part of a reference laser beam are amplified and phase conjugated thereby producing a first amplified output laser beam emanating from the first laser element and an additional amplified output laser beam emanating from the at least one additional laser element. The first amplified output laser beam and the additional amplified output laser beam are combined into the powerful laser beam.

The present invention enables a user to combine individual laser beams, from many discrete lasers, into a single coherent laser beam. The present invention has many uses including, but not limited to, directed energy laser weapons with very high power capacity from very large arrays of diode lasers and low cost laser machining and laser projection television systems.

The invention is susceptible to modifications and alternative forms. Specific embodiments are shown by way of example. It is to be understood that the invention is not limited to the particular forms disclosed. The invention covers all modifications, equivalents, and alternatives falling within the spirit and scope of the invention as defined by the claims.

BRIEF DESCRIPTION OF THE DRAWINGS

The accompanying drawings, which are incorporated into and constitute a part of the specification, illustrate specific embodiments of the invention and, together with the general description of the invention given above, and the detailed description of the specific embodiments, serve to explain the principles of the invention.

DETAILED DESCRIPTION OF THE INVENTION

Figure 1A:
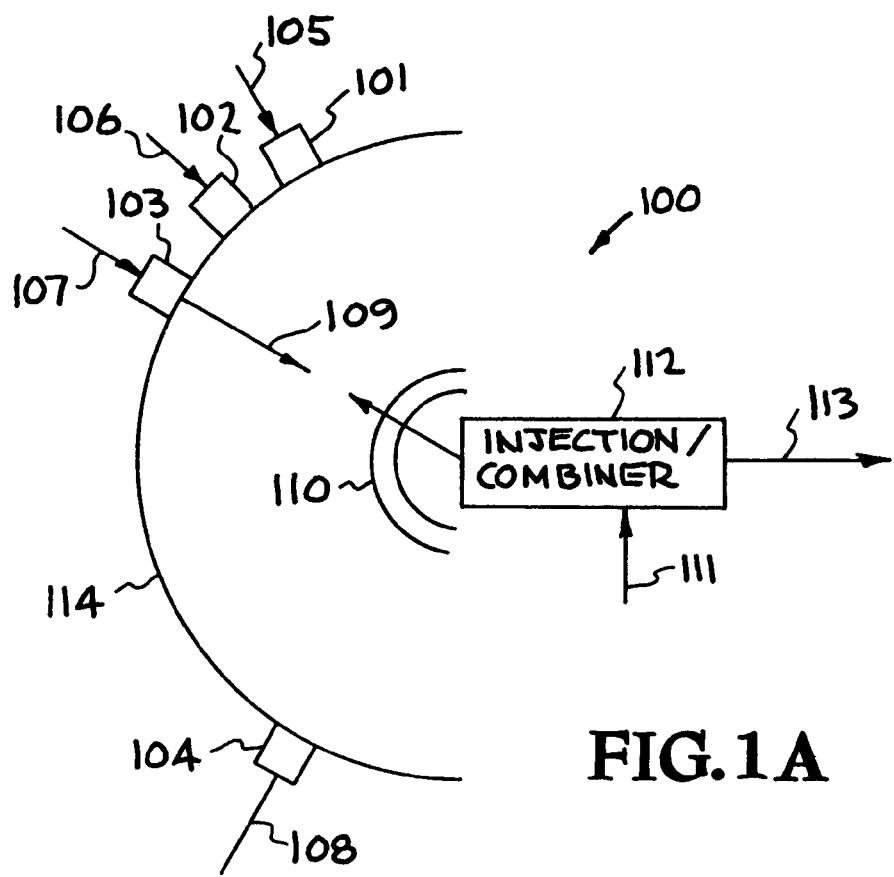
FIG. 1 illustrates an embodiment of a system incorporating the present invention.

Referring now to the drawings, to the following detailed description, and to incorporated materials, detailed information about the invention is provided including the description of specific embodiments. The detailed description serves to explain the principles of the invention. The invention is susceptible to modifications and alternative forms. The invention is not limited to the particular forms disclosed. The invention covers all modifications, equivalents, and alternatives falling within the spirit and scope of the invention as defined by the claims.

Applicant has developed the present invention to enable a user to combine individual laser beams from many discrete surface emitting diode lasers, Vertical Cavity Surface Emitting Laser (VCSEL), into a single coherent laser beam. The present invention provides a mechanism by which a reference beam and a pump beam can be spatially arranged in such VCSEL lasers. The present invention provides a system of arranging the pump, reference, and injection beams for the phasing together of many laser beams from VCSEL lasers. Uses of the invention include directed energy laser weapons with very high power capacity from very large arrays of diode lasers, low cost laser machining, laser projection television systems, and other products that use lasers.

The present invention is an improvement of the invention (s) disclosed and claimed in U.S. patent application Ser. No. 10/265,461 filed Oct. 4, 2002 by the Applicant in this patent application, John F. Holzrichter, and Anthony J. Ruggiero, for a phased laser array for generating a powerful laser beam. U.S. patent application Ser. No. 10/265,461 filed Oct. 4, 2002 and issued as U.S. Pat. No. 6,693,943 on Feb. 17, 2004. The disclosure of U.S. patent application Ser. No. 10/265,461 filed Oct. 4, 2002 to John F. Holzrichter and Anthony J. Ruggiero for a phased laser array for generating a powerful laser beam, issued as U.S. Pat. No. 6,693,943 on Feb. 17, 2004, is incorporated herein by this reference.

Referring now to FIG. 1, an embodiment of a system incorporating the present invention is illustrated. The system is generally designated by the reference numeral 100. The system 100, as illustrated, provides a layout of a multiplicity of laser elements positioned on a reference surface 114. Laser element 1 is identified by the reference numeral 101. Laser element 2 is identified by the reference numeral 102. Laser element 3 is identified by the reference numeral 103. Additional laser elements are provided through laser element n identified by the reference numeral 104.

Laser element 1, laser element 2, laser element 3, and laser element n are types of laser elements that will be described subsequently, for example laser element 1, laser element 2, laser element 3, and laser element n can be discrete surface emitting diode laser elements. There may be a few individual laser elements such as laser elements 101 and 102 or a large number of individual laser elements, for example, a few thousand individual laser elements.

An injection laser signal is operatively connected to laser element 1. The part of the injection laser signal is represented by the reference numeral 105. Another part of the injection laser signal is operatively connected to laser element 2. This part of the injection laser signal is represented by the reference numeral 106. Another part of the injection laser signal is operatively connected to laser element 3. This part of the injection laser signal is represented by the reference numeral 107. Another part of the injection laser signal is operatively connected to laser element "n." This part of the injection laser signal is represented by the reference numeral 108. The injection laser signal parts 105, 106, 107, and 108 can be produced by any of a number of devices that will provide an injection laser signal; for example, they may be produced by a laser beam from a single master laser delivered by optical fibers to the laser elements 105, 106, 107, and 108 The injection laser signals produce re-circulating (i.e., pump) laser beams within the laser elements 101, 102, 103, and 104.

An input reference beam that illuminates all laser elements is identified by the reference numeral 110. As shown in FIG. 1, the input reference beam 110 is shown being directed into laser element 3; however, it is understood that the input reference beam 110 is directed into all of the laser elements 101, 102, 103, and 104. The input reference beam 110 is produced by an injector means 112. An oscillator input beam identified by the reference numeral 111 is directed into injector means and combines 112. Injector means and combiner 112 produce the input reference beam 110.

As shown in FIG. 1, laser element 3, reference numeral 103, produces a phase conjugated and amplified output amplified beam 109. It is to be understood that laser element 1, laser element 2, laser element 3, and laser element n each produce an output amplified beam 109. Each laser element 101, 102, 103, and 104 is locked to a fixed laser frequency by the parts of the injection laser signals 105, 106, 107, and 108. Each laser element 101, 102, 103, and 104 receives a part of the reference laser beam 110 that enters each of the laser element cavities and the part that enters is phase conjugated, producing a return beam that is also amplified within the laser element. The phase conjugated returned and amplified output beams 109 have distortions corrected and are increased in intensity. The laser medium of laser elements 101, 102, 103, and 104 enables 4-wave phase conjugation of the injection laser signals 105, 106, 107, and 108. The mix of the injection laser signals 105, 106, 107, and 108 and the reference laser beams 110 effectively produces a phase and amplitude grating within the laser medium and produces the phase conjugated and amplified output laser beams 109 emanating from the laser elements 101, 102, 103, and 104. The output laser beams 109 are the phase conjugates of part of the reference laser beam 110 that enters said elements. The output amplified beams 109 are directed into injector and combiner 112. The injector and combiner 112 produces an amplified and phase corrected output beam identified by the reference numeral 113.

The injector and combiner 112 receives the oscillator input beam 111 and produces the input reference beam 110 and also separates the input reference beam 110 from the output amplified beams 109. The output amplified beams 109 have their distortions corrected and are increased in intensity as they return to the injector and combiner 112. The output beams combine together as they approach and enter the injector-combiner element. The injector and combiner 112 may include a Faraday rotator and a polarizer, or a dispersive phase conjugation technique may be used in each laser element to enable the return beam to pass to one side of and not enter the master oscillator element, thus avoiding damage to the master oscillator reference system.

The system 100 illustrates how a multiplicity of diode lasers can be arrayed and phase locked together with a master oscillator and a Faraday rotator-polarizer system to allow the output beam to bypass the oscillator structure. The system 100 illustrates how a multiplicity of laser elements are aligned such that they can receive an input master reference laser beam, which is phase conjugated and reflected back to the central source. The laser elements and amplifiers are polarization preserving.

In one embodiment, each laser element is locked by a laser fiber that enters from one of the sides and each laser element has an internal feedback structure that causes the internal circulating wave to be at the same frequency for all laser elements and to sustain a large area spatial mode. The circulating pump laser beams within the diode laser elements are locked to a frequency identical to the common injected laser wavelength.

The diode laser elements have a circulating internal laser beam (often called a pump laser beam) that is fixed in frequency by the injected wave and the internal feedback structures inside the laser element cavity. To make these individual laser elements work in a system, an incoming master reference oscillator beam is directed toward an array of individual diode laser elements. Part of the master reference wave enters each laser element where-upon it is "4-wave" phase conjugated in each diode laser element, and is amplified and returned and collected into a high power laser beam, at the wavelength defined by the injection laser and the direction defined by the phase conjugation process. The laser element is polarization preserving.

A variation is that the wave can be phase conjugated and returned at a slightly different wavelength and direction, if desired. This occurs when "non-degenerate" 4-wave phase-conjugation is employed as the phase conjugation process. In addition, the system 100 shown in FIG. 1 illustrates how the diodes can be arrayed on a curved surface 114, similar to a mirror; it is not necessary that they be so arranged. The reference surface can be a flat surface rather than the curved surface 114 shown in FIG. 1. There are many other arrangements of diodes on reference surfaces that can have beneficial qualities such as enhancing heat removal from the diode structures, or minimizing cross sectional dimensions, and others. These are made possible by employing laser element structures that enable diodes to be phase-conjugated (modulo $2\pi$) (2 pi), as long as the distance from the oscillator/input means of said laser elements is within the "coherence-length" of the reference laser beam.

The system 100, in connection with the laser elements 101, 102, 103, and 104, uses a master phase reference laser beam which illuminates the output apertures of each one of the multiplicity of representative individual active lasers, laser elements 101, 102, 103, and 104. This master phase reference laser is noted as MPRL herein. The MPRL beam impinges upon the output apertures of all of the individual laser elements, thereby illuminating laser elements 101, 102, 103, and 104. The individual lasers are called ILEs for Individual Laser Elements, and there may be a few of them or a few thousand such ILEs in an example phase-conjugate mirror system.

Part of the MPRL beam is transmitted into each individual laser element cavity by entering through the partially transmitting output mirror. This output mirror might (as an example) have a reflectivity of 90%, at the wavelength of, or at the direction of, the MPRL beam, meaning 10% of the MPRL beam (that strikes the aperture of each element) enters the cavity, and is amplified by the laser medium. This MPRL beam is then reflected by the interference pattern set up between the internal circulating (i.e., pump) laser beam inside of each ILE and the incoming MPRL beam.

Because of the physics of the reflection process, known to experts in the field as 4-wave Phase Conjugation, when the injection laser beam parts are 11 at the same frequency and the-reference laser beam parts are all at the same frequency (not necessarily the same as the injection beam part frequencies), the incoming MPRL is reflected directly back in the direction that it came from. Furthermore, it returns with a conjugate phase which enables the return beam to retrace its incoming path precisely in both direction and with a special inverting phase that removes optical path aberrations. By conjugated phase it is meant that when the beam returns to its origin (the MPRL output aperture), its phase will be identical to the phase it had when it started, except that it will be traveling in the reverse direction. This causes the many sources of phase-distorting aberrations within the laser elements, within any fill lenses, and in the air paths to be corrected.

This phase inverting process enables the part of the incoming MPRL beam, that enters one of the ILEs, to return to the original aperture of MPRL with all optical distortions corrected. By extension, the return beams from all of the ILEs return to the original aperture of the MPRL, mimicking the output reference beam, but traveling in the "converging direction" leading to a collective beam of very good phase quality, strongly enhanced in amplitude (by the amplification process that took place inside each of the ILEs during the process of generating the returning output beam). All of the individual returning beams join together to form a uniform, smooth phase and amplitude, output beam 113 of the System 100.

Figure 2:
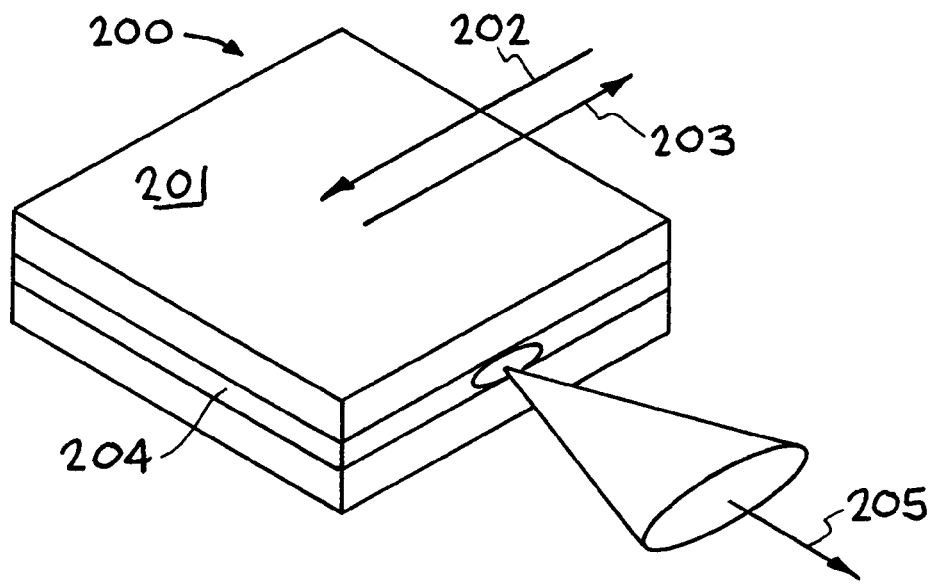
FIG. 2 illustrates a semiconductor laser element, showing locations and directions of the input reference beam and phase-conjugated output beam.

Referring now to FIG. 2, a semiconductor laser element is illustrated. The overall system is designated generally by the reference numeral 200. FIG. 2 shows locations and directions of an input reference beam 202 and a phase-conjugated output beam 203. The system 200 illustrates a laser element 201 that is particularly suited for integration into the optical system of a laser system that enables the user to combine individual laser beams, from many discrete lasers, into a single coherent laser beam. An incoming reference beam is amplified and phase conjugated into a single, high-power, phase-coherent laser beam.

Figure 3:
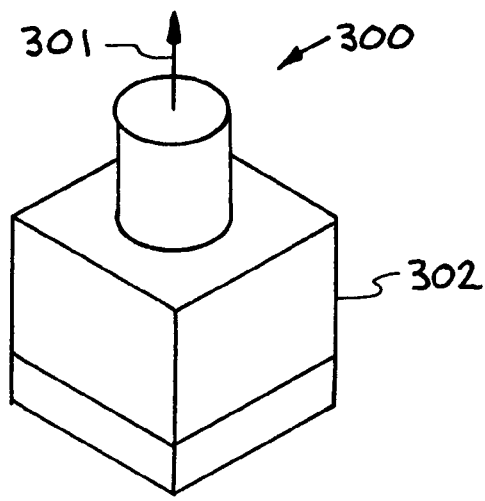
FIG. 3 illustrates an often used geometry for semiconductor lasers, the vertical emitting laser cavity, also known as a VCSEL.

Referring now to FIG. 3, a vertical emitting laser cavity, also known as a VCSEL is illustrated. The system overall is designated generally by the reference numeral 300. The system 300 consist of semiconductor lasers, with several semiconductor layers 302, whose laser beam is emitted normal to the surface of the semiconductor wafer, and whose output mirror is in the plane of the output surface. A laser beam 301 is shown exiting along the normal direction of a VCSEL semiconductor laser cavity.

The laser system 300 is being used increasingly because it is easy to make arrays of such lasers using conventional semiconductor manufacturing technologies. Such lasers are made with several semiconductor materials as active and reflecting layers, and often include external lenses or mirrors to enhance the laser action. One particular device is made by a San Francisco Bay Area company called Novalux. It has designed and brought into production a high power, high quality VCSEL laser, with an output mirror, separate from the semiconductor gain medium.

Figure 4:
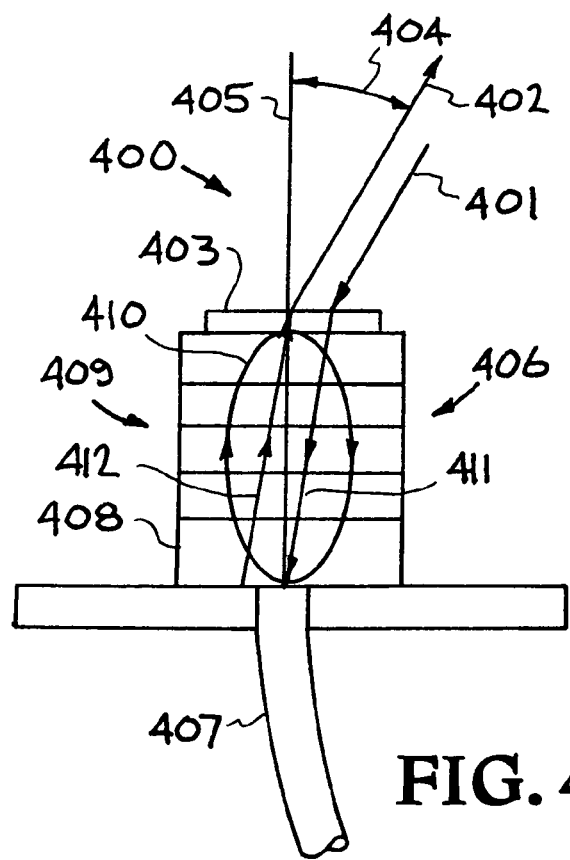
FIG. 4 illustrates a system for causing each of the individual VCSELs to emit a single, phase coherent beam formed by the combination of the waves from each of the several individual VCSEL lasers on one (or more) wafers.

Referring now to FIG. 4, a system is shown for causing each of the individual VCSELs to emit a single, phase coherent beam formed by the combination of the waves from each of the several individual VCSEL lasers on one (or more) wafers. The system is designated generally by the reference numeral 400. The system shown in FIG. 4 includes the following individual components: reference input laser beam 401, phase conjugated output beam 402, output mirror 403, semiconductor laser structure 406, optical fiber and aperture 407, rear laser mirror 408, power 409, and internal circulating laser pump waves 410.

The output mirror 403 provides 100% reflective at normal incidence and very low, nearly 0%, reflectivity at input beam angle 404. The input beam angle is typically an angle from the normal direction 405, and for example may be an angle of e.g., 30°. The optical fiber and aperature 407 is provided for the injection beam to lock the frequency of internal laser pump waves. The internal circulating laser pump waves 410 are shown and arrows 411 and 412 also indicate the general directions of the reference input laser wave and the phase conjugated, output beam while inside the cavity.

The system 400 relies on one or more of the following concepts: (1) The normal laser wave of the individual laser element, i.e., the VCSEL cavity, oscillates back and forth in the semiconductor gain medium and between the mirrors of the traditional, vertical laser cavity. That is, the normally partially transmitting output mirror at the surface of the vertical cavity is replaced with a 100% reflective mirror. In typical laser cavities, the output mirror is partially reflective, and allows the laser beam to escape into free space (and be used by the operator).

(2) The part of the external reference wave is fed into each VCSEL laser cavity at an angle (typically 20–40 degrees) to the normal axis of the semiconductor wafer's surface. The output mirror that confines the internal laser beam, while being 100% reflective for the internal laser wave, is designed to be nearly 100% transmitting to the part of the reference wave, which is directed into the cavity at an example angle of 30° to the normal direction. When the incoming reference beam traverses the cavity output mirror, and enters the semiconductor layers, the wave is bent toward the axis of the structure, and follows a path that overlaps the internal laser beam. This occurs because inside the semiconductor laser structure, the reference beam has a mode shape sufficiently similar to the mode and path of the internal circulating laser wave, that efficient four-wave phase conjugation and amplification of the reference wave takes place. The mode matching occurs efficiently because the method makes use of the high dielectric constant of the semiconductor material, $n=3-4$ (i.e., n=the index of refraction of material at the wavelength of the laser and reference wave). Hence when the external wave enters at an angle to the normal, it is bent toward the internal normal direction in accord with Snell's law for refraction of light waves across the boundary of two media possessing differing indices of refraction:

$$n_{ext} \sin \theta_{ext} = n_{internal} \sin \theta_{internal}$$

for GaAs semiconductor materials $n_{internal}=3.2$, for $\theta_{ext}=30$ deg., and $n_{ext}$=index of air=1. Thus for this example $\sin \theta_{internal}=1/6.4 \Rightarrow \theta_{internal}=9.9°$. In summary, the external reference beam is bent strongly toward the axis-direction (also called normal direction) inside the semiconductor laser cavity, and thus it overlaps the internally circulating, laser pump beam very well. The overlap causes phase conjugation to take place, and a reflected laser beam, from the phase conjugating grating, is amplified and exits the cavity very effectively.

Such semiconductor laser cavities can be optimized for this effect by employing other injection techniques such as using the Brewster angle input direction, which enables the reference beam to enter a higher index of refraction material of the semiconductor laser with zero loss.

While the system in FIG. 4 shows the use of an optical fiber to bring injection laser light into the cavity from the rear side, other methods can be used. One is to place a very low efficiency, e.g., 1% scattering, grating on the surface of a 99% reflective mirror to scatter light in and out of the cavity. Another technique is to place an optical scattering center in the center of the output mirror of FIG. 4 to scatter obliquely directed injection laser light into the pump laser mode, in order to lock the mode of the pump waves to a single frequency. Another technique is to remove a small part of the reflecting rear mirror to enable the injection beam to enter from the rear. Another part includes drilling a small hole through the substrate of the VCSEL structures to allow the entry of light from the rear side.

Another idea is to employ VCSEL lasers, made using the DFB, i.e., distributed feedback mode, of beam reflection. This mode enables such lasers to sustain pump beams with large transverse modes, which enhances the interaction of the incoming reference waves as shown in FIG. 4.

High power laser beams have many applications ranging from metal cutting, to cinema projection, to energy transmission, and to directed-energy military weapons. Presently, individual semiconductor diode lasers are manufactured in many configurations, such as the well known GaAs hetrojunction laser. These have many advantages for the above mentioned applications, except for the fact that they generate relatively little power, typically 0.1 watts. When increased in size to generate higher power levels, such as 1 to 10 Watts from one laser structure, the output beam becomes multi-moded and is not good for focusing. If two or more low power laser diodes, of the above mentioned example of 0.1 Watt GaAs diode lasers, are placed close to each other, such that their output beams point in the same direction, the combined laser beam will be multi-mode in character. The combined laser beam, when focused by a large collecting lens to a small spot, will appear as two separate spots at the focus (corresponding to each individual laser beam).

In one embodiment the system includes a non-linear element operatively connected within the first laser element and additional laser elements. In another embodiment the frequency of the reference laser wave is different than the injected laser wave. This condition leads to "non-degenerate" 4-wave phase-conjugation. In this case, the output laser element beams travel in a different direction than the input part of the reference laser beam if angular dispersing elements are present. This causes them to miss the input means system. In another embodiment, fill lenses are used to prevent power loss and to increase the spatial coherence of the output laser beam.

Applicant has developed the present invention which provides a method and system that economically and rapidly measures and corrects the phase of a large number of individual laser elements so that their combined beams fuse together to become a powerful, focusable laser beam for many desired applications. Herein, systems and methods describe implementation of arrays of laser diodes, or other small lasers, such that the combined laser output beams of said arrays are in phase and can be focused as if the combined beam behaved as if it were a single-mode laser beam. Systems and methods are described that enable the combining the beams from many sub laser units into a substantially coherent, single-mode laser beam of high power, high energy, and high focusability (i.e., high coherence). Using the techniques described herein, small laser units, especially semiconductor lasers, can be combined using methods and systems herein, such that they produce a laser beam that simulates the output of a much larger laser.

Recently, distributed feedback diode lasers have been constructed that produce an internal laser mode pattern that has a single, large diameter transverse mode (e.g., at least 0.1 mm diameter), a narrow linewidth, (e.g., about 1 MHz), and are able to be locked to a single input frequency. Applicants have developed a phase conjugated laser system based upon such laser elements. The availability of these diodes and the phase conjugation demonstrations using a single diode laser, enable the user, by applying the concepts described herein, to cause many discrete diode lasers to be phase-locked together to form a collective, phase coherent output beam. The spatial structure of the collective beam reflects that of the initial reference laser beam and it's temporal structure is substantially monochromatic having a uni-phase wavefront, caused by locking together the output beam phases from each diode, modulo $2\pi$.

The system may use a master laser oscillator source of input (i.e., injected) coherent light, parts of said reference laser beam are received by each diode laser, and whose purpose is to lock each of the internal laser beams of each oscillator to a common wavelength. Each laser element then phase-conjugates and amplifies part of the beam from a second oscillator, called the input reference oscillator beam, and re-radiates it, phase conjugated (modulo $2\pi$), with respect to part of the incoming reference beam, without the need for a central phase conjugator nor for the need of electro-optic phase shifters on each diode laser structure. The output beams, from each of the diode lasers, travel back in the direction of the incoming oscillator beam, making a collective beam with vastly increased power and coherence.

Figure 5:
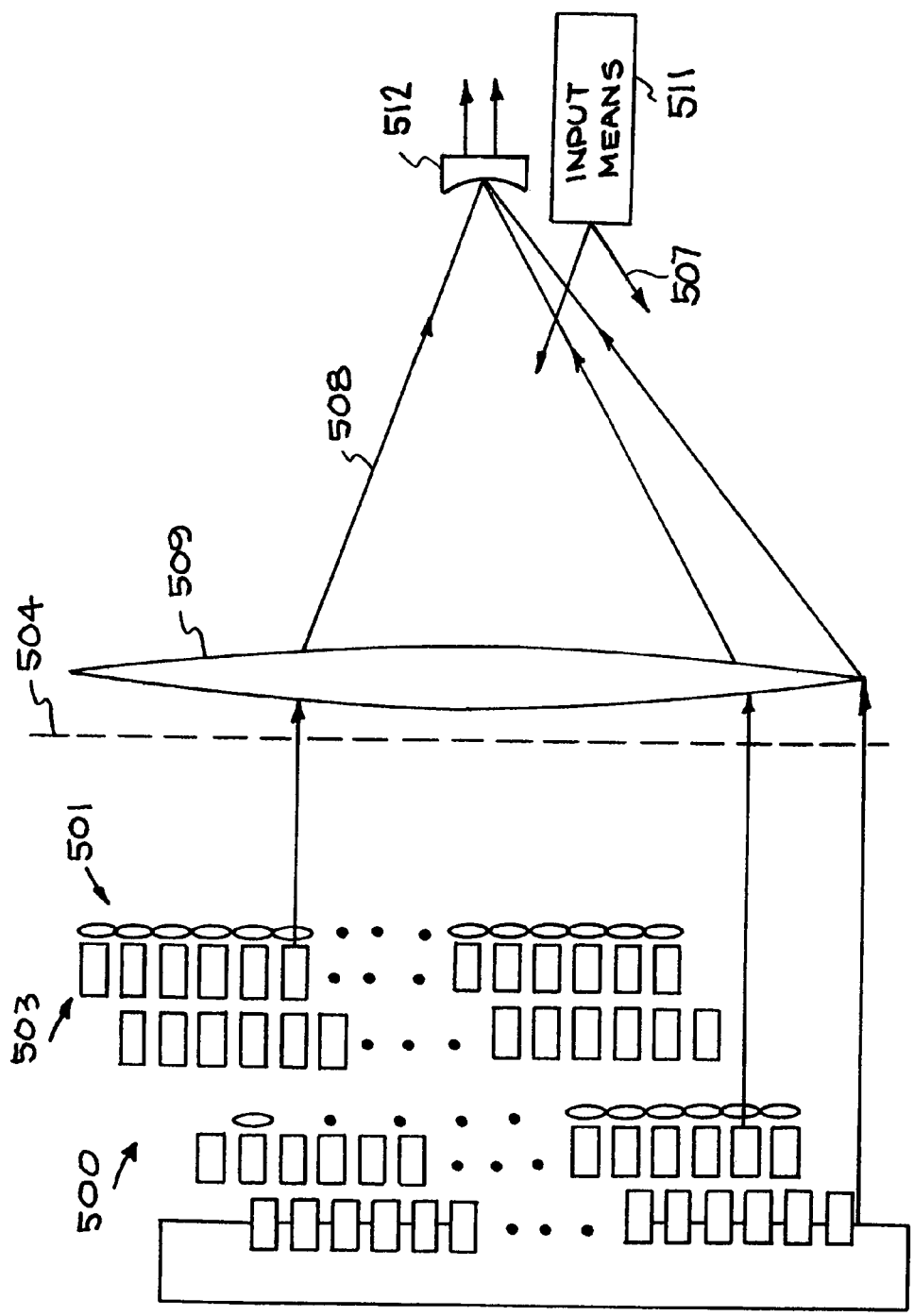
FIG. 5 illustrates an embodiment of a system incorporating the present invention.

Referring now to FIG. 5, another embodiment of a system incorporating the present invention is illustrated. The system is generally designated by the reference numeral 500. The system 500, as illustrated, provides a layout of a multiplicity of laser arrays positioned on a reference surface. Laser array 1 is identified by the reference numeral 501. Laser array 2 is identified by the reference numeral 503. Additional laser arrays are provided.

FIG. 5 shows a large collection lens 509. It collects and directs the reference beam 507 from the input means 511 to the fill optics, which then directs part of the reference beam energy into each laser 501, 503, etc. Then the fill optics, send all of the output energy to the collection optic 509 which collects the output waves and sends them to the beam combiner 512, also called output means, whereby the efficiency of the system is increased dramatically.

The system 500 illustrates how a multiplicity of diode lasers can be arrayed and phase locked together and how a multiplicity of laser elements are aligned such that they can receive an input master reference laser beam. The system 500 enables a user to combine individual laser beams from many discrete surface emitting diode lasers, e.g., Vertical Cavity Surface Emitting Laser (VCSEL), into a single coherent laser beam. The present invention provides a mechanism by which a reference beam and a pump beam can be spatially arranged in such VCSEL lasers. The present invention provides a system of arranging the pump, reference, injection beams, and output means for the phasing together of many laser beams from VCSEL lasers. Uses of the invention include directed energy laser weapons with very high power capacity from very large arrays of diode lasers, low cost laser machining, laser projection television systems, and other products that use lasers.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

The invention claimed is:

1. A system for generating a powerful laser beam, comprising:

a laser element array including a first laser element and at least one additional laser element, said first laser element and said least one additional laser element having a rear laser mirror, an output mirror, and semiconductor laser material between said rear laser mirror and said output mirror, wherein said output mirror is 100% reflective at normal incidence and <5% reflective at an input beam angle;

an injector for directing a first part of an injection laser signal into said first laser element and for directing at least one additional part of the injection laser signal into said at least one additional laser element;

said laser element array transforming said first part of the injection laser signal and said at least one additional injection laser signal into a first circulating laser beam in said first laser element and at least one additional circulating laser beam in said at least one additional laser element;

a reference laser beam source for directing a first part of a reference laser beam into said first laser element to mix with said first circulating laser beam and for directing at least one additional part of a reference laser beam into said at least one additional laser element to mix with said at least one additional circulating laser beam;

an amplifier and phase conjugater for amplifying and phase conjugating said first part of a reference laser beam and said at least one additional part of a reference laser beam and producing a first amplified output laser beam emanating from said first laser element and at least one additional amplified output laser beam emanating from said at least one additional laser element; and a combiner for combining said first amplified output laser beam and said at least one additional amplified output laser beam into the powerful laser beam.

2. The system for generating a powerful laser beam of claim 1, wherein said input beam angle is between 20° and 70°.

3. The system for generating a powerful laser beam of claim 2, wherein said input beam angle is Brewster's angle for the incoming part of the reference beam.

4. A system for generating a powerful laser beam, comprising:

laser element means comprising a first laser element and a second laser element, said first laser element and said second laser element having a rear laser mirror, an output mirror, and semiconductor laser material between said rear laser mirror and said output mirror, wherein said output mirror is 100% reflective at normal incidence and >5% reflective at an input beam angle;

initiating means for directing a first part of the injection laser signal into said first laser element producing a first circulating laser beam, and for directing a second part of the injection laser signal into said second laser element producing a second circulating laser beam;

input means for directing a first part of a reference laser beam into said first laser element to mix with said first circulating laser beam, and for directing a second part of a reference laser beam into said second laser element to mix with said second circulating laser beam;

amplification and phase conjugation means for amplifying and phase conjugating said first part of a reference laser beam to produce a first amplified output laser beam from said first laser element, and a second amplified output laser beam from said at least one additional laser element, and combiner means for combining said first amplified output laser beam and said second amplified output laser beam into the powerful laser beam.

5. The system for generating a powerful laser beam of claim 4, wherein said input beam angle is between 20° and 70°.

6. The system for generating a powerful laser beam of claim 5, wherein said input beam angle is Brewster's angle for the incoming part of the reference beam.

7. A method of generating a powerful laser beam, comprising the steps of:

providing a first laser element having a rear laser mirror, an output mirror, and semiconductor laser material between said rear laser mirror and said output mirror, providing at least one additional laser element having a rear laser mirror, an output mirror, and semiconductor laser material between said rear laser mirror and said output mirror, injecting a first part of the injection laser signal into said first laser element at an input beam angle between 20° and 70°, injecting at least one additional part of the injection laser signal into said at least one additional laser element, injecting a first part of a reference laser beam into said first laser element, injecting at least one additional part of a reference laser beam into said at least one additional laser element, amplifying and phase conjugating said first part of a reference laser beam and said at least one additional part of a reference laser beam thereby producing a first amplified output laser beam emanating from said first laser element and an additional amplified output laser beam emanating from said at least one additional laser element, and combining said first amplified output laser beam and said additional amplified output laser beams into the powerful laser beam.

8. The system for generating a powerful laser beam of claim 7, wherein said step of injecting a first injection laser signal into said first laser element is injected at an input beam angle equal to Brewster's angle for the incoming part of the reference beam.

* * * * *